US006252792B1

(12) United States Patent
Marshall et al.

(10) Patent No.: US 6,252,792 B1
(45) Date of Patent: Jun. 26, 2001

(54) FIELD PROGRAMMABLE PROCESSOR ARRAYS

(75) Inventors: Alan Marshall; Anthony Stansfield, both of Bristol (GB); Jean Vuillemin, Paris (FR)

(73) Assignee: Elixent Limited, Bristol (GB)

( * ) Notice: Subject to any disclaimer, the term of this patent is extended or adjusted under 35 U.S.C. 154(b) by 0 days.

(21) Appl. No.: 09/341,566

(22) PCT Filed: Jan. 28, 1998

(86) PCT No.: PCT/GB98/00262

§ 371 Date: Jul. 13, 1999

§ 102(e) Date: Jul. 13, 1999

(87) PCT Pub. No.: WO98/33277

PCT Pub. Date: Jul. 30, 1998

(30) Foreign Application Priority Data

Jan. 29, 1997 (EP) ................................................. 97300563

(51) Int. Cl.[7] ...................................................... G11C 5/06

(52) U.S. Cl. ................................................ 365/63; 326/41

(58) Field of Search ................................... 326/41; 365/63

(56) References Cited

U.S. PATENT DOCUMENTS

| 4,236,204 | | 11/1980 | Groves | 364/200 |
|---|---|---|---|---|
| 5,204,556 | | 4/1993 | Shankar | 307/465 |
| 5,208,491 | | 5/1993 | Ebeling et al. | 307/465 |
| 5,233,539 | * | 8/1993 | Agrawal et al. | 364/489 |
| 5,291,431 | | 3/1994 | Ho et al. | 364/760 |
| 5,426,379 | | 6/1995 | Trimberger | 326/39 |
| 5,493,239 | | 2/1996 | Zlotnick | 326/38 |
| 5,498,975 | * | 3/1996 | Cliff et al. | 326/10 |
| 5,568,646 | | 10/1996 | Jagger | 395/800 |
| 5,583,450 | | 12/1996 | Trimberger et al. | 326/41 |

FOREIGN PATENT DOCUMENTS

| 0 726 532 | 8/1996 | (EP) . |
|---|---|---|
| WO 95/22205 | 8/1995 | (WO) . |
| 97/46948 | 12/1997 | (WO) . |

OTHER PUBLICATIONS

D. Bursky "Gate Arrays Face Onslaught of Dense and Flexible FPGA's", *Electronic Design,* vol. 43, No. 13, Jun. 26, 1995, pp. 85–86, 88, 90, 94, and 96.

D. Bursky, "SRAM Blocks and Antifuse Logic Combine In New FPGA's", *Electronic Design,* vol. 43, No. 16, Aug. 7, 1995, pp. 115, 116, and 118.

G. Borriello, et al. "The Triptych FPGA Architecture", *IEEE Transactions On Very Large Scale Integration (VLSI) Systems,* vol. 3, No. 4, Dec., 1995, pp. 491–500.

(List continued on next page.)

*Primary Examiner*—David Nelms
*Assistant Examiner*—M. Tran (57) ABSTRACT

An integrated circuit has a field programmable circuit region arranged as a generally rectangular array of rows and columns of circuit areas. Some of the circuit areas each provide a respective processing unit for performing operations on data on at least one respective input signal path to provide data on at least one respective output signal path. Others of the circuit areas each provide a respective switching section; and the processing units and the switching sections are arranged alternately in each row and in each column. Each of a substantial proportion of the switching sections provides a programmable connection between at least some of the signal paths of those of the processing units adjacent that switching section in the same column and in the same row. A dense layout can be obtained with efficient local interconnections, especially in the case where one or more of the processing units has a plural-bit input and/or plural-bit output, and at least some of the signal paths are provided by respective plural-bit busses.

37 Claims, 8 Drawing Sheets

OTHER PUBLICATIONS

Nagendra, et al. "Digit pipelined Arithmetic On Fine–Grain Array Processors", Journal of VLSI Signal Processing, vol. 9, No. 3. Apr. 1, 1995, pp. 193–209.

Maxfield, C, "Logic That Mutates While–U–Wait", EDN (Eur. Ed.), Nov. 7, 1996, vol. 41, No. 23, pp. 137–140, 142.

Patent abstract of Japan, vol. 006, No. 104 (P–122), Jun. 15, 1982 (Abstract of Japanese Patent Document No. JP 57 036347 A (NEC Corp.), Feb. 27, 1982).

Patent abstract of Japan, vol. 007, No. 073 (P–186), Mar. 25, 1983 (Abstract of Japanese Patent Document No. JP 58 003040 A (NEC Corp.), Jan. 8, 1983).

Paneerselvam, G., et al., "Design and Implementation of an Area and Time Efficient Systolic Parallel Booth Multiplier", Proceedings of the Midwest Symposium on Circuits and Systems, Detroit, Aug. 16–18, 1993, vol. 2, No. Symp. 36, Aug. 16, 1993, pp. 1497–1500, *Institute Of Electrical And Electronics EngineerS*, see paragraph 3.

Balsara, P.T., et al., "Understanding VLSI Bit Serial Multipliers", *IEEE Transactions On Education,* vol. 39, No. 1, Feb. 1, 1996, pp. 19–28, see paragraph II–V.

Dadda, L., "On Serial–Input Multipliers for Two's Compliment Numbers", *IEEE Transactions On Computers,* vol. 38, No. 9, Sep. 1989, pp. 1341–1345, see paragraph III.

Satyanarayana, et al., "A Comprehensive Approach to the Design of Digit–Serial Modified Booth Multipliers", *Proc. 26Th Southeastern Symp. On System Theory,* 1994, pp. 229–233, see paragraph 3.

Wo, et al., "Exploiting Neural Network Parallelism", *1st Int. Workshop in Parallel Processing,* 1994, pp. 586–592, see paragraph 3.

"The Thumb Architecture," Advanced RISC Machines Limited Specification, pp. 1–2, (1995).

Patterson, D.A., et al., *Computer Architecture: A Quantitive Approach*, San Mateo, California: Morgan Kaufmann Publishers, Inc., Chapter 4.5: pp. 160–166, Appendix E: PP. E–1 –E–24, (1995).

Chen, D.C., et al., "A Reconfigurable Multiprocessor IC for Rapid Prototyping of Real–Time Data Paths, " IEEE International Solid–State Circuits Conference, pp. 74–75, (Feb. 1992).

Yueng, A.K., et al., "A Data–Driven Multiprocessor Architecture (PADDI2) for Irregular Computation–Intensive DSP Algorithms, " IEEE VLSI Signal Processing Workshop, pp. 1–5 (Oct. 1992).

Mirsky, E., et al., "MATRIX: A Reconfiguable Computing Architecture with Configurable Instruction Distribution and Deployable Resources," FCCM '96: IEEE Symposium on FPGAs for Custom Computing Machines, Apr. 17–19, 1996, Napa, California, USA pp. 1–10.

DeHon, A., "Reconfigurable Architecture for General–Purpose Computing, " Technical Report 1586, MIT Artificial Intelligence Laboratory, pp. 257–296.

Koren, I., "High–Speed Multiplication," *Computer Arithmetic Algorithms*, Englewood Cliffs, New Jersey: Prentice Hall, pp. 99–103, (1993).

Hartle, R.I., et al., "The serial–serial bit...," *Digit–Serial Computation*, Norwell USA: Kluwer Academic Publishing, pp. 1–2, (1995).

\* cited by examiner

FIELD PROGRAMMABLE PROCESSOR ARRAYS

BACKGROUND OF THE INVENTION

This invention relates to field programmable processor arrays, that is, arrays of processing units which are selectively connectable by signal paths one to another, and in particular to such arrays which are provided as integrated circuits.

The problems with which the present invention (or at least preferred embodiments of it) is concerned are to provide a dense circuit layout, efficient interconnections between the processing units and flexibility in the manner in which the processing units may be interconnected.

SUMMARY OF THE INVENTION

In accordance with the present invention, there is provided an integrated circuit having a field programmable circuit region arranged as a generally rectangular array of rows and columns of circuit areas, wherein: some of the circuit areas each provide a respective processing unit (such as an arithmetic logic unit) for performing operations on data on at least one respective input signal path to provide data on at least one respective output signal path; others of the circuit areas each provide a respective switching section; the processing units and the switching sections are arranged alternately in each row and in each column; and each of a substantial proportion (and preferably all) of the switching sections provides a programmable connection between at least some of the signal paths of those of the processing units adjacent that switching section in the same column and in the same row. By arranging the circuit in this way, a dense layout can be obtained with efficient local interconnections, especially in the case where one or more of the processing units has a plural-bit input and/or a plural-bit output, and at least some of the signal paths are provided by respective plural-bit busses.

A first type of the connections provided by the switching sections are between such signal paths which may be generally collinear with or parallel to each other, allowing the paths to be selectably concatenated to produce longer connections. In this case and in the case where at least one of the processing units and the processing units adjacent thereto each have a first input, a second input and an output; the output of said one processing unit is preferably connectable: by such a first type of connection to the first input of the next processing unit in one direction in the same row; by such a first type of connection to the first input of the next processing unit in the one direction in the same column; by such a first type of connection to the second input of the next processing unit in the opposite direction in the same row; and by such a first type of connection to the second input of the next processing unit in the opposite direction in the same column. In this way, the output of a first processing unit can be selectably passed to any of the four adjacent processing units in the same row or column ("a second processing unit"), where it can be processed and then passed back to the first processing unit or passed on to any of the other three adjacent processing units adjacent the second processing unit.

A second type of the connections provided by the switching sections are between such signal paths which may be generally orthogonal to each other. Thus the signal paths can change direction to enable flexible routing. In this case and in the case where at least one of the processing units and the processing units adjacent thereto each have a first input, a second input and an output, the output of said one processing unit is preferably connectable: by such a second type of connection in the same column to the first input of the diagonally adjacent processing unit in said one row direction and said one column direction; by such a second type of connection in the same row to the first input of the diagonally adjacent processing unit in said opposite row direction and said one column direction; by such a second type of connection in the same column to the second input of the diagonally adjacent processing unit in said opposite row direction and said opposite column direction; and by such a second type of connection in the same row to the second input of the diagonally adjacent processing unit in said one row direction and said opposite column direction. Thus, the output from a first processing unit can be selectably routed to the first inputs of two of the diagonally adjacent processing units, and to the second inputs of the other two diagonally adjacent processing units.

Preferably substantially all of the input and output signal paths are oriented in directions substantially parallel to the rows or the columns, thus enabling a dense layout to be achieved.

The integrated circuit preferably further comprises a plurality of inter switching section signal paths, each of which extends from a respective first one of the switching sections to a respective second one of the switching sections in the same row in a direction primarily generally parallel to that row, or in the same column in a direction primarily generally parallel to that column, each of the inter switching section signal paths being programmably connectable by the respective first switching section to others of the signal paths at that first switching section, and being programmably connectable by the respective second switching section to others of the signal paths at that second switching section. Accordingly, medium and long range connections can be selectably provided.

For one type of the inter switching section signal paths, there may be no such switching sections in the respective row or column between the respective first and second switching sections.

For another type of the inter switching section signal paths, the respective first and second switching sections may have a number (preferably one less than a power of two) of other such switching sections therebetween in the respective row or column. Thus, long range connections are provided reducing the number of intermediate switches which may be required, and accordingly reducing the propagation delay which would be caused thereby.

For a further type of the inter switching section signal paths, each signal path may have a spine portion extending in a direction generally parallel to the respective row or column and first and second end portions each extending in a direction generally orthogonal to the respective row or column and interconnecting the spine portion and the respective first and second switching sections, respectively. Since the spine portions do not connect to the switches directly, the choice of the physical position of the conductors in the spine portion is flexible, and this flexibility enables denser layouts to be achieved. For at least some of the inter switching section signal paths of said further type, the respective first and second switching sections may have a number (preferably one less than a power of two) of other such switching sections therebetween in the respective row or column. Thus, long range connections are provided reducing the number of intermediate switches which may be required, and accordingly reducing the propagation delay which would be caused thereby. At least some of the inter switching section signal paths of said further type preferably each have at least one tap portion extending in a direction generally orthogonal to the respective row or column and interconnecting the spine portion and a respective such other switching section. Accordingly, even greater flexibility is provided.

At least some of the switching sections preferably each include a respective register and/or buffer having an input and an output each switchably connectable to at least some of the signal paths at that switching section. This allows signals to be retimed or buffered without using one of the processing units for that purpose. Retiming and buffering of time-critical signals allows configurations to run at higher clock speeds, increasing the rate of operation.

BRIEF DESCRIPTION OF THE DRAWINGS

A specific embodiment of the present invention will now be described, by way of example, with reference to the accompanying drawings, in which.

DESCRIPTION OF THE PREFERRED EMBODIMENTS

In the following description, the terms "horizontal", "vertical", "North", "South", "East" and "West" have been used to assist in an understanding of relative directions, but their use is not intended to imply any restriction on the absolute orientation of the embodiment of the invention.

The processor array which forms the embodiment of the invention is provided in an integrated circuit. At one level, the processor array is formed by a rectangular (and preferably square) array of "tiles" 10, one of which is shown bounded by a thick line in FIG. 1. Any appropriate number of tiles may be employed, for example in a 16×16, 32×32 or 64×64 array. Each tile 10 is rectangular (and preferably square) and is divided into four circuit areas. It is preferable for these tiles to be logically square (to provide symmetry in connection), although it is of less significance that they be physically square (this may have some advantage in providing symmetry in timing, but this will generally be less likely to be of significance). Two of the circuit areas 12, which are diagonally opposed in the tile 10, provide the locations for two arithmetic logic units ("ALUs"). The other two circuit areas, which are diagonally opposed in the tile 10, provide the locations for a pair of switching sections 14.

Figure 1:
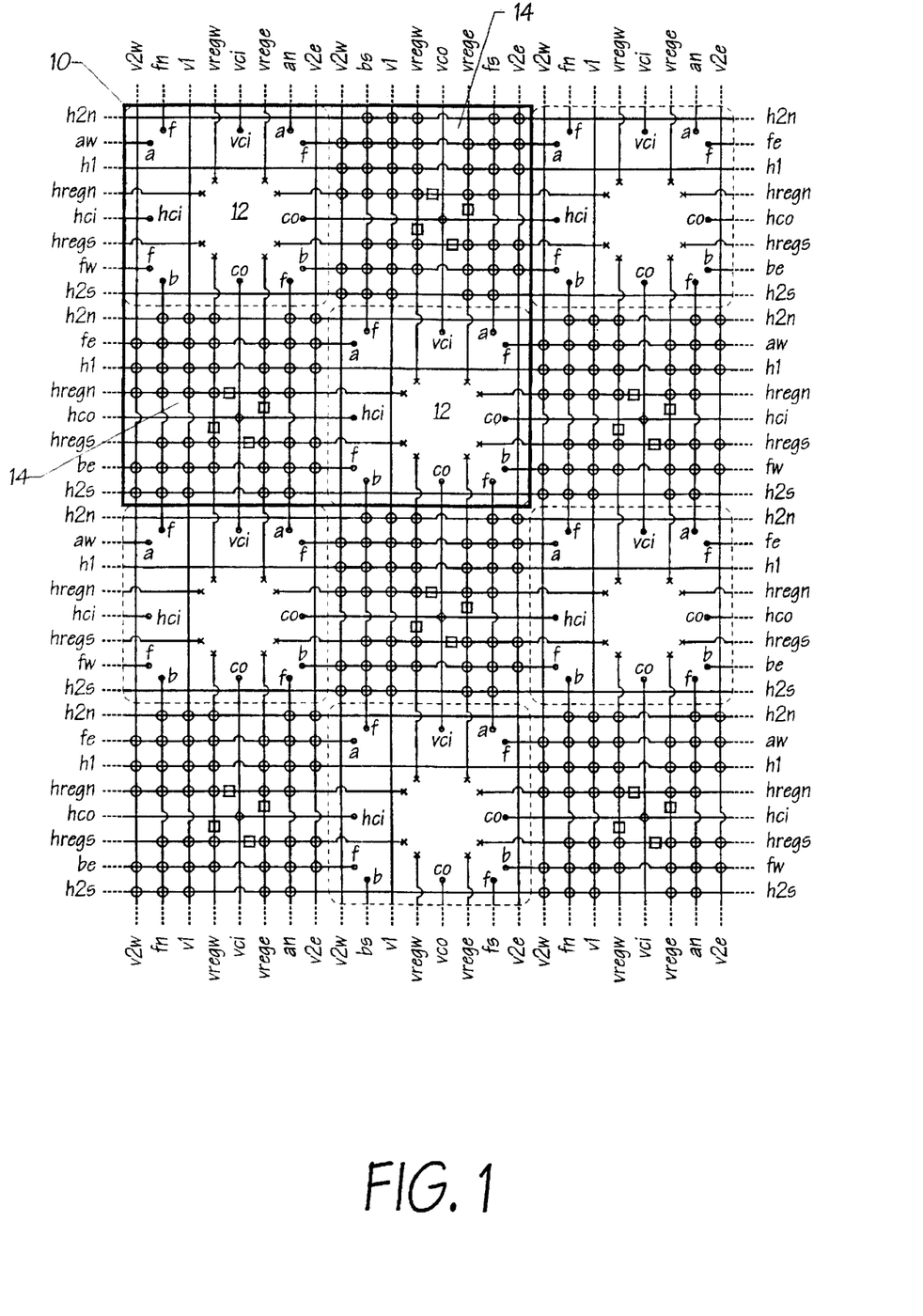
FIG. 1 shows part of a processor array, illustrating six switching sections and the locations of six arithmetic logic units.
Figure 2:
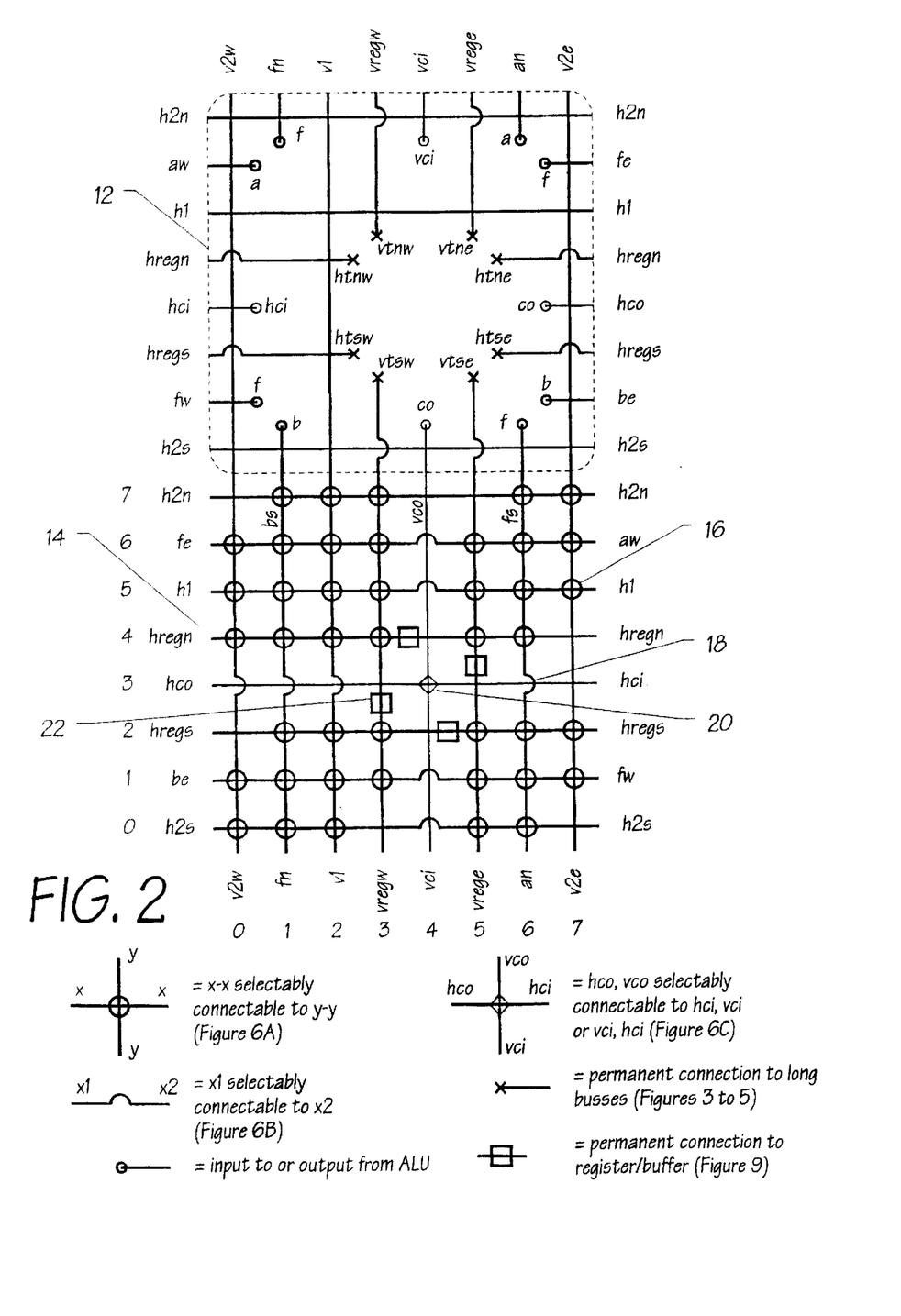
FIG. 2 is a diagram of part of the arrangement shown in FIG. 1 on a larger scale, illustrating one of the switching sections and one of the locations of the arithmetic logic units.

Referring to FIGS. 1 and 2, each ALU has a first pair of 4-bit inputs a, which are directly connected within the ALU, a second pair of 4-bit inputs b, which are also directly connected within the ALU, and four 4-bit outputs f, which are directly connected within the ALU. Each ALU also has an independent pair of 1-bit carry inputs hci, vci, and a pair of 1-bit carry outputs co, which are directly connected within the ALU. The ALU can perform standard operations on the input signals a, b, hci, vci to produce the output signals f, co, such as add, subtract, AND, NAND, OR, NOR, XOR, NXOR and multiplexing and optionally can register the result of the operation. The instructions to the ALUs may be provided from respective 4-bit memory cells whose values can be set via the "H-tree" structure described below, or may be provided on the bus system which will be described below.

Figure 6A:
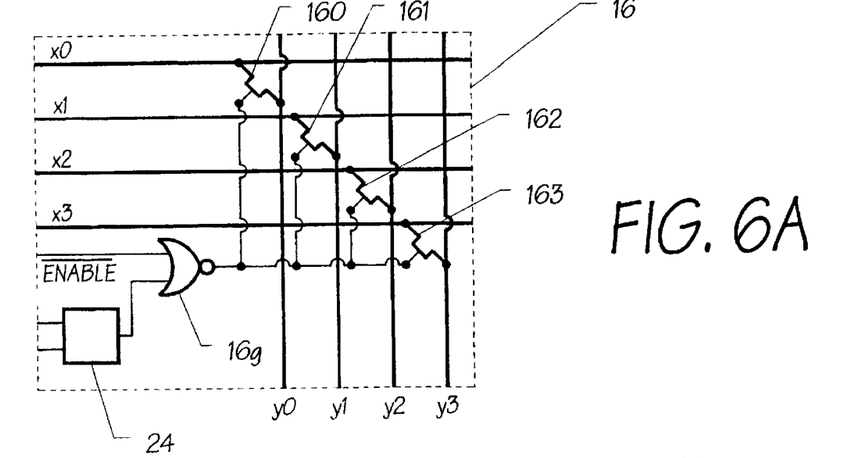
FIG. 6A shows in detail the circuitry of one type of programmable switch in the switching sections, for connecting a pair of 4-bit busses which cross each other.
Figure 6B:
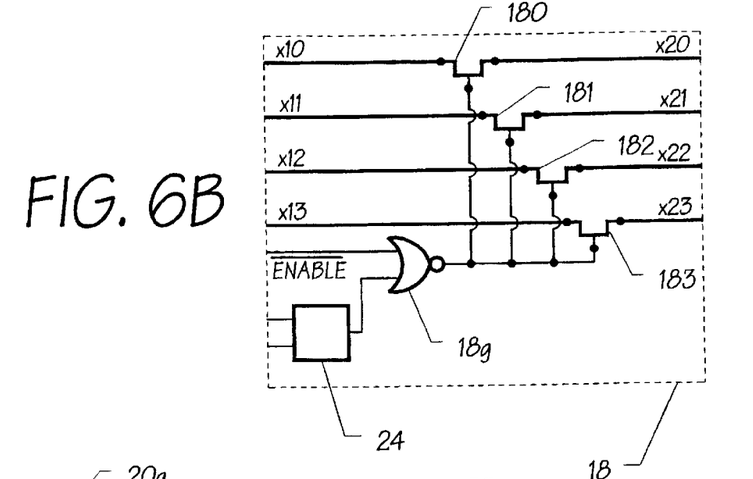
FIG. 6B shows in detail the circuitry of another type of programmable switch in the switching sections, for connecting a pair of 4-bit busses which meet each other end to end.
Figure 6C:
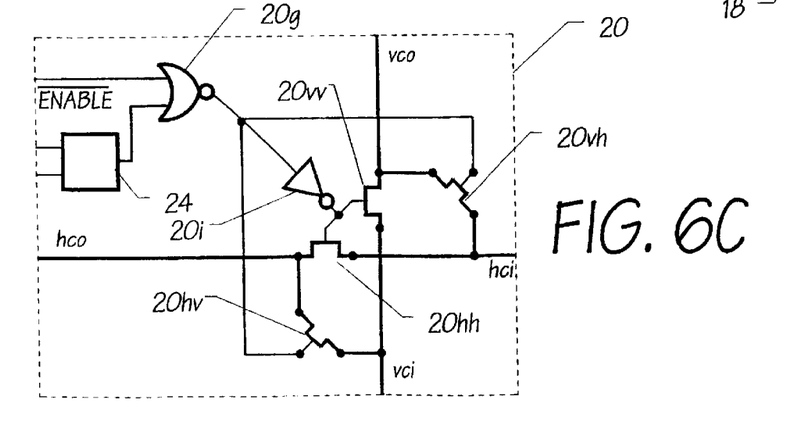
FIG. 6C shows in detail the circuitry of another type of programmable switch in the switching sections, for connecting carry-bit busses.

At the level shown in FIGS. 1 and 2, each switching section 14 has eight busses extending across it horizontally, and eight busses extending across it vertically, thus forming an 8×8 rectangular array of 64 crossing points, which have been numbered in FIG. 2 with Cartesian co-ordinates. All of the busses have a width of four bits, with the exception of the carry bus vc at X=4 and the carry bus hc at Y=3, which have a width of one bit. At many of the crossing points, a 4-gang programmable switch 16 is provided which can selectively connect the two busses at that crossing point. At some of the crossing points, a 4-gang programmable switch 18 is provided which can selectively connect two busses which meet end to end at that crossing point, without any connection to the bus at right angles thereto. At the crossing point at (4, 3), a programmable switch 20 (for example as shown in FIG. 6C) is provided which can selectively connect the carry busses vc, hc which cross at right angles at that point.

The horizontal busses in the switching section 14 will now be described.

At Y=0, busses h2s are connectable by programmable switches 16 to the vertical busses at X=0, 1, 2, 5, 6. The busses h2s have a length of two tiles and are connectable end to end in every other switching section 14 by a programmable switch 18 at (4, 0).

At Y=1, a bus be extending from an input b of the ALU to the West is connectable by switches 16 to the vertical busses at X=0, 1, 2, 3. Also, a bus fw extending from an output f of the ALU to the East is connectable by switches 16 to the vertical busses at X=5, 6, 7. The ends of the busses be, fw are connectable by a programmable switch 18 at (4, 1).

At Y=2, a bus hregs is connectable by programmable switches 16 to the vertical busses at X=1, 2, 3, 5, 6, 7.

At Y=3, a bus hco extends from the carry output co of the ALU to the West to a programmable switch 20 at (4, 3), which can connect the bus hco (a) to a carry bus hci extending to the carry input hci of the ALU to the East or (b) to a carry bus vci extending to the carry input vci of the ALU to the South.

At Y=4, a bus hregn is connectable by programmable switches 16 to the vertical busses at X=0, 1,2,3,5,6.

At Y=5, busses h1 are connectable to the vertical busses at X=0, 1, 2, 3, 5, 6, 7. The busses h1 have a length of one tile and are connectable end to end in each switching section 14 by a programmable switch 18 at (4, 5).

At Y=6, a bus fe extending from an output f of the ALU to the West is connectable by switches 16 to the vertical busses at X=0, 1, 2, 3. Also, a bus aw extending from an input a of the ALU to the East is connectable by switches 16 to the vertical busses at X=5, 6, 7. The ends of the busses fe, aw are connectable by a programmable switch 18 at (4, 6).

At Y=7, busses h2n are connectable by programmable switches 16 to the vertical busses at X=1, 2, 3, 6, 7. The busses h2n have a length of two tiles and are connectable end to end in every other switching section 14 by a programmable switch 18 at (4, 7), staggered with respect to the programmable switches 18 connecting the busses h2s at (4, 0).

The vertical busses in the switching section 14 will now be described.

At X=0, busses v2w are connectable by programmable switches 16 to the horizontal busses at Y=0, 1, 4, 5, 6. The busses v2w have a length of two tiles and are connectable end to end in every other switching section 14 by a programmable switch 18 at (0, 3).

At X=1, a bus fn extending from an output f of the ALU to the South is connectable by programmable switches 16 to the horizontal busses at Y=0, 1, 2. Also, a bus bs extending from an input b of the ALU to the North is connectable by switches 16 to the horizontal busses at Y=4, 5, 6, 7. The ends of the busses fn, bs are connectable by a programmable switch 18 at (1, 3).

At X=2, busses v1 are connectable to the horizontal busses at Y=0, 1, 2, 4, 5, 6, 7. The busses v1 have a length of one tile and are connectable end to end in each switching section 14 by a programmable switch 18 at (2, 3).

At X=3, a bus vregw is connectable by programmable switches 16 to the horizontal busses at Y=1, 2, 4, 5, 6, 7.

At X=4, a bus vco extends from the carry output co of the ALU to the North to the programmable switch 20 at (4, 3), which can connect the bus vco (a) to the carry bus hci extending to the carry input hci of the ALU to the East or (b) to the carry bus vci extending to the carry input vci of the ALU to the South.

At X=5, a bus vrege is connectable by programmable switches 16 to the horizontal busses at Y=0, 1, 2, 4, 5, 6.

At X=6, a bus an extending from an input a of the ALU to the South is connectable by switches 16 to the horizontal busses at Y=0, 1, 2. Also, a bus fs extending from an output f of the ALU to the North is connectable by programmable switches 16 to the horizontal busses at Y=4, 5, 6, 7. The ends of the busses an, fs are connectable by a programmable switch 18 at (6, 3).

At X=7, busses v2e are connectable by programmable switches 16 to the horizontal busses at Y=1, 2, 5, 6, 7. The busses v2e have a length of two tiles and are connectable end to end in every other switching section 14 by a programmable switch 18 at (7, 3) staggered with respect to the programmable switches 18 connecting the busses v2w at (0, 3).

As shown in FIG. 2, the busses bs, vco, fs are connected to input b, output co and output f, respectively, of the ALU to the North of the switching section 14. Also, the busses fe, hco, be are connected to the output f, output co and input b of the ALU, respectively, to the West of the switching section 14. Furthermore, the busses aw, hci, fw are connected to the input a, input ci and output f, respectively, of the ALU to the East of the switching section 14. Moreover, the busses fn, vci, an are connected to the output f, input ci and input a, respectively, of the ALU to the south of the switching section 14.

In addition to these connections, the busses vregw, vrege are connected via respective programmable switches 18 to 4-bit connection points vtsw, vtse, respectively, (shown by crosses in FIG. 2) in the area 12 of the ALU to the North of the switching section 14. Also, the busses hregs, hregn are connected via respective programmable switches 18 to 4-bit connection points htse, htne, respectively, in the area 12 of the ALU to the West of the switching section 14. Furthermore, the busses hregs, hregn are connected via respective programmable switches 18 to 4-bit connection points htsw, htnw, respectively, in the area 12 of the ALU to the East of the switching section 14. Moreover, the busses vregw, vrege are connected via respective programmable switches 18 to 4-bit connection points vtnw, vtne, respectively, in the area 12 of the ALU to the south of the switching section 14. These connection points vtnw, vtne, htne, htse, vtse, vtsw, htsw, htnw will be described below in further detail with reference to FIGS. 3 to 5.

Figure 9:
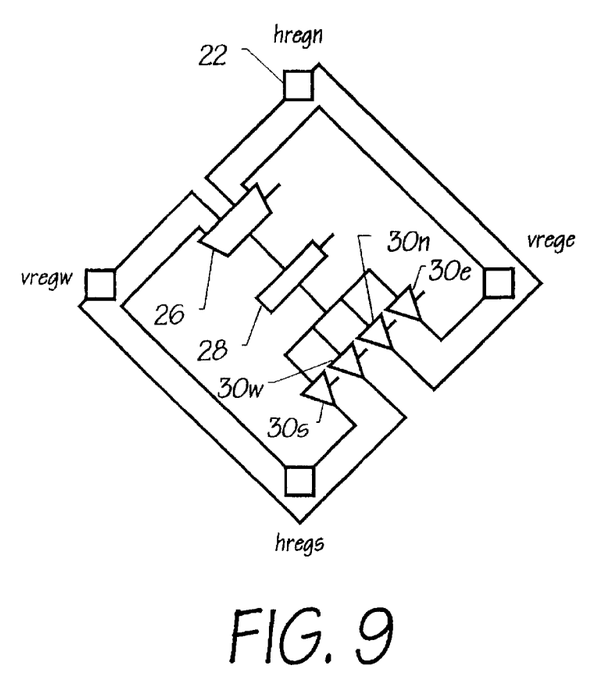
FIG. 9 shows a buffer and register which may be used in each switching section.

Also, as shown in FIG. 2, the busses hregn, vrege, hregs, vre gw have respective 4-bit connection points 22 (shown by small squares in FIG. 2) which will be described below in further detail with reference to FIG. 9.

Figure 3:
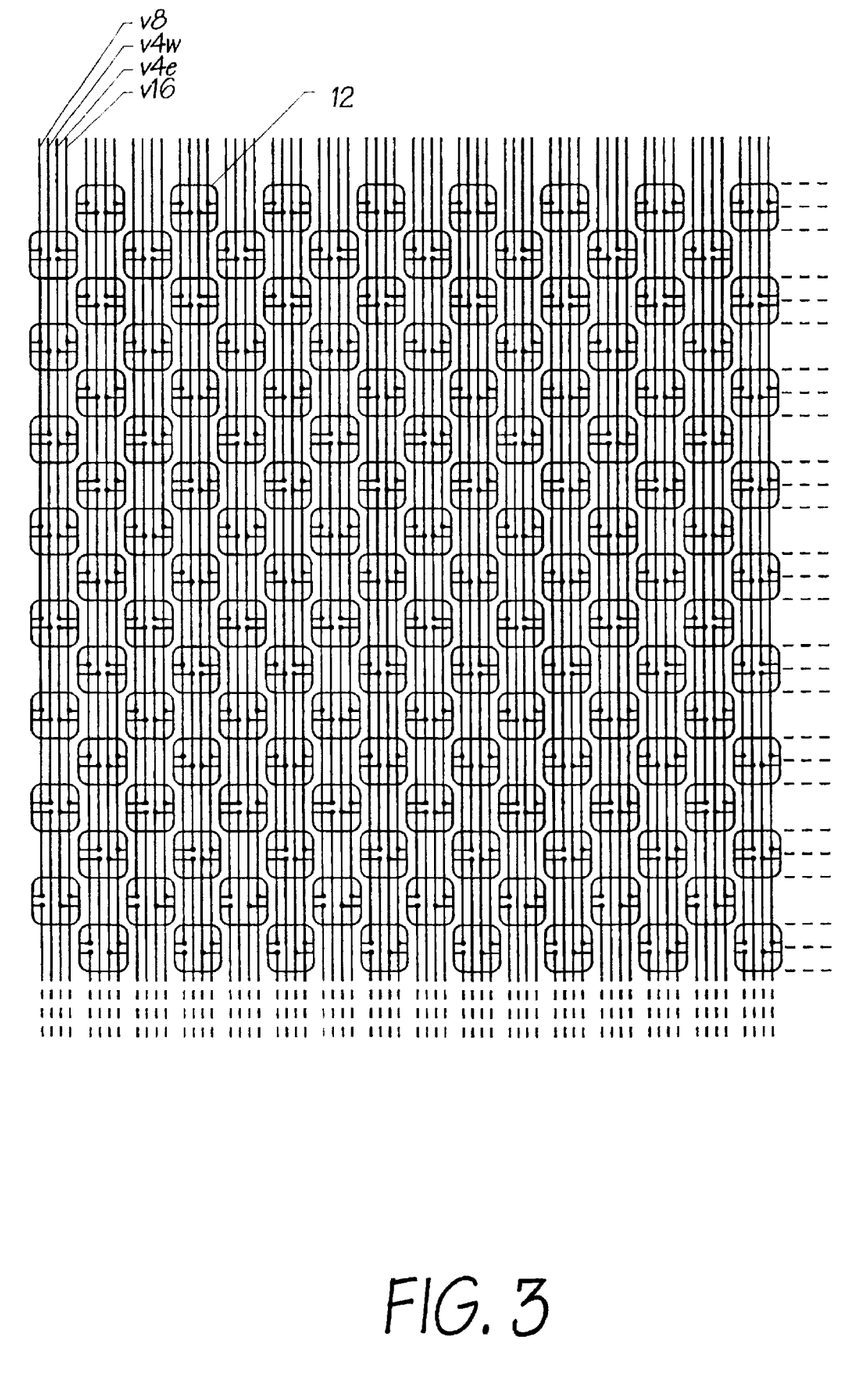
FIG. 3 shows part of the processor array shown in FIG. 1 on a smaller scale, illustrating the locations of the arithmetic logic units and "vertical" busses extending across them.

FIG. 3 shows one level of interconnections between the locations of the arithmetic logic units, which are illustrated by squares with rounded corners. A group of four 4-bit busses v8, v4w, v4e, v16 extend vertically across each column of ALU locations 12. The leftmost bus v8 in each group is in segments, each having a length generally of eight tiles. The leftmost but one bus v4w in each group is in segments, each having a length generally of four tiles. The rightmost but one bus v4e in each group is in segments, again each having a length generally of four tiles, but offset by two tiles from the leftmost but one bus v4w. The rightmost bus v16 in each group is in segments, each having a length generally of sixteen tiles. At the top edge of the array, which is at the top of FIG. 4, and at the bottom edge the lengths of the segments may be slightly greater than or shorter than specified above.

Figure 5:
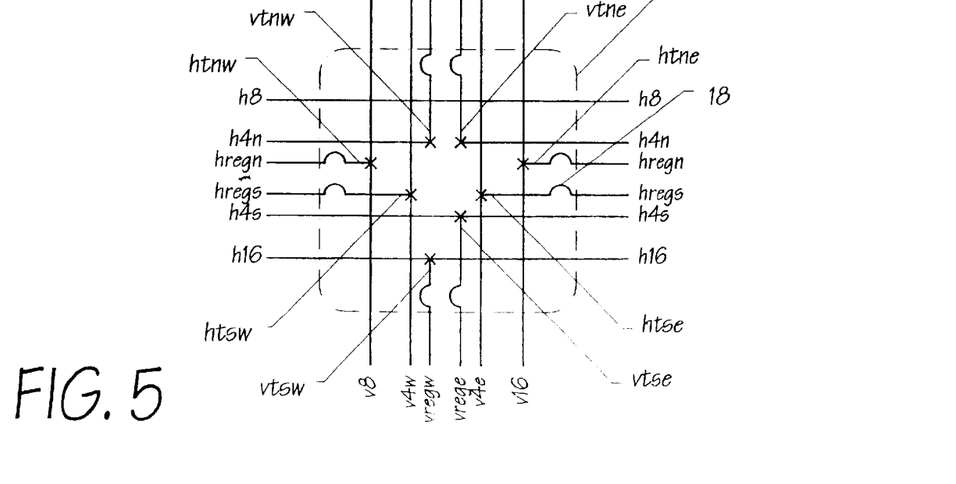
FIG. 5 shows the interconnections between the the busses of FIGS. 2, 3 and 4 at the location of one of the arithmetic logic units.

Referring to FIGS. 3 and 5, where each group of four busses v8, v4w, v4e, v16 crosses each ALU location 12, four 4-bit tap connections are made at the connection points htnw, htsw, htse, htne. The ends of the bus segments take priority in being so connected over a connection to a bus segment which crosses the ALU location.

Figure 4:
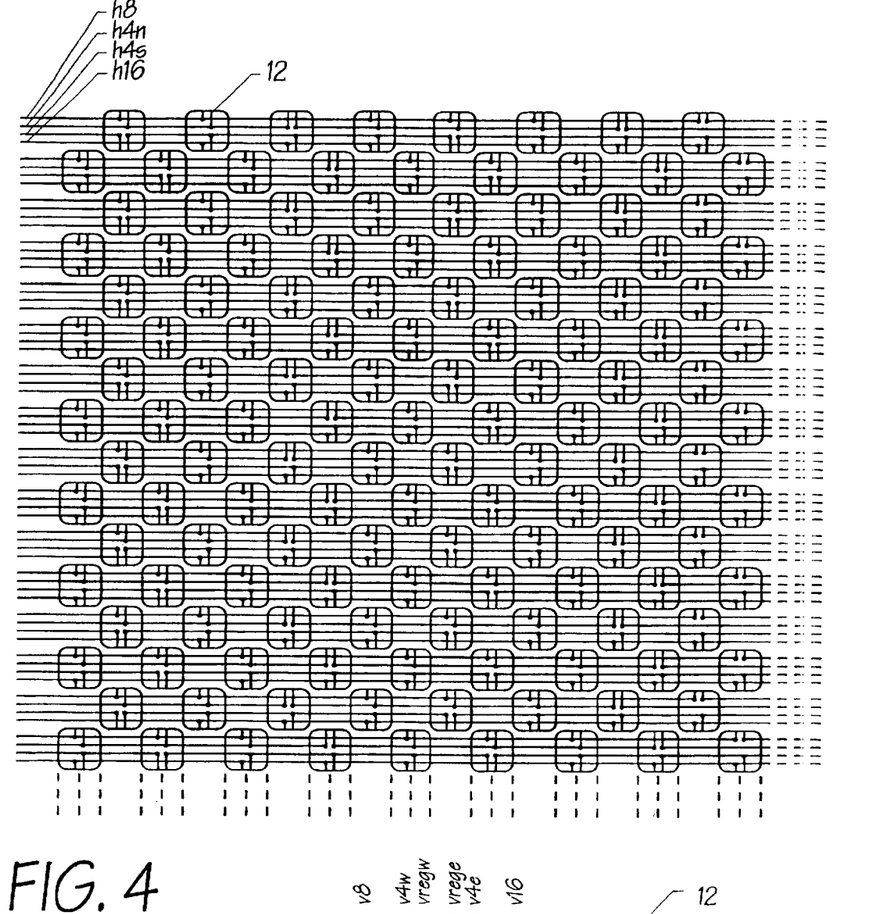
FIG. 4 is similar to FIG. 3, but illustrating "horizontal" busses extending across the locations of the arithmetic logic units.

Similarly, as shown in FIGS. 4 and 5, a group of four 4-bit busses h8, h4n, h4s, h16 extend horizontally across each row of ALU locations 12. The uppermost bus h8 in each group is in segments, each having a length generally of eight tiles. The uppermost but one bus h4n in each group is in segments, each having a length generally of four tiles. The lowermost but one bus h4s in each group is in segments, again each having a length generally of four tiles, but offset by two tiles from the uppermost but one bus h4n. The lowermost bus h16 in each group is in segments, each having a length generally of sixteen tiles. At the left hand edge of the array, which is at the left of FIG. 4, and at the right hand edge the lengths of the segments may be slightly greater than or shorter than specified above. Where each group of busses h8, h4n, h4s, h16 crosses each ALU location 12, a further four 4-bit tap connections are made at the connection points vtnw, vtsw, vtse, vtne. The ends of the bus segments take priority in being so connected over a connection to a bus segment which crosses the ALU location.

As shown in FIG. 5, the connection points htnw, htsw, htne, htse are connected via programmable switches to the busses hregn, hregs of the switching sections to the West and the East of the ALU location. Also, the connection points vtnw, vtne, vtsw, vtse are connected via programmable switches to the busses vregw, vrege of the switching sections to the North and the South of the ALU location.

The programmable connections 16 between pairs of 4-bit busses which cross at right angles will now be described with reference to FIG. 6A. The conductors of the horizontal busses are denoted as x0, x1, x2, x3, and the conductors of the vertical busses are denoted as y0, y1, y2, y3. Between each pair of conductors of the same bit significance, a respective transistor 160, 161, 162, 163 is provided. The gates of the transistors 160, 161, 162, 163 are connected in common to the output of a NOR gate 16g, which receives as its two inputs an inverted ENABLE signal from a single bit memory cell, which may be shared by a group of the switches, and the inverted content of a single bit memory cell 24. Accordingly, only when the ENABLE signal is high and the content of the memory cell 24 is high, the conductors x0, x1, x2, x3 are connected by the transistors 160, 161, 162, 163, respectively, to the conductors y0, y1, y2, y3, respectively.

The programmable connections 18 between pairs of 4-bit busses which meet each other end to end in line will now be described with reference to FIG. 6B. The conductors of one bus are denoted as x10, x11, x12, x13, and the conductors of the other bus are denoted as x20, x21, x22, x23. Between each pair of conductors of the same bit significance, a respective transistor 180, 181, 182, 183 is provided. The gates of the transistors 180, 181, 182, 183 are connected in common to the output of a NOR gate 18g, which receives as its two inputs an inverted ENABLE signal from a single bit memory cell, which may be shared by a group of the switches, and the inverted content of a single bit memory cell 24. Accordingly, only when the ENABLE signal is high and the content of the memory cell 24 is high, the conductors x10, x11, x12, x13 are connected by the transistors 180, 181, 182, 183, respectively, to the conductors x20, x21, x22, x23, respectively.

The programmable connections 20 between the carry conductors hco,vco,hci,vci will now be described with reference to FIG. 6C. The horizontal carry output conductor hco is connected to the horizontal carry input conductor hci and the vertical carry input conductor vci via transistors 20hh, 20hv, respectively. Furthermore, the vertical carry output conductor vco is connected to the vertical carry input conductor vci and the horizontal carry input conductor hci via transistors 20vv, 20vh, respectively. The gates of the transistors 20hh, 20vv are connected in common to the output of an inverter 20i, and the gates of the transistors 20hv, 20vh and the input to the inverter 20i are connected to the output of a NOR gate 20g. The NOR gate 20g receives as its two inputs an inverted ENABLE signal from a single bit memory cell, which may be shared by a group of the switches, and the inverted content of a single bit memory cell 24. Accordingly, when the ENABLE signal is high, the conductors hco, vco are connected to the conductors hci, vci, respectively, or to the conductors vci, hci, respectively, in dependence upon the content of the memory cell 24.

Figure 7:
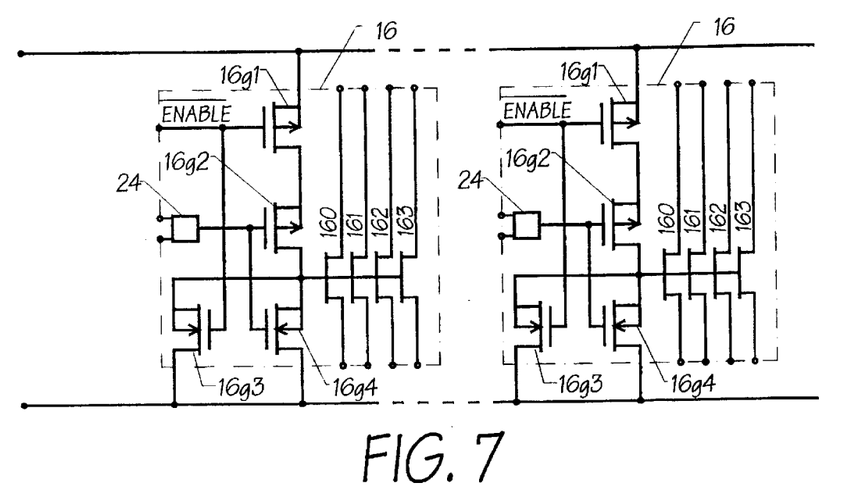
FIG. 7 shows the circuitry of a series of NOR gates which may be used in the programmable switches of FIGS. 5 and 6.
Figure 8:
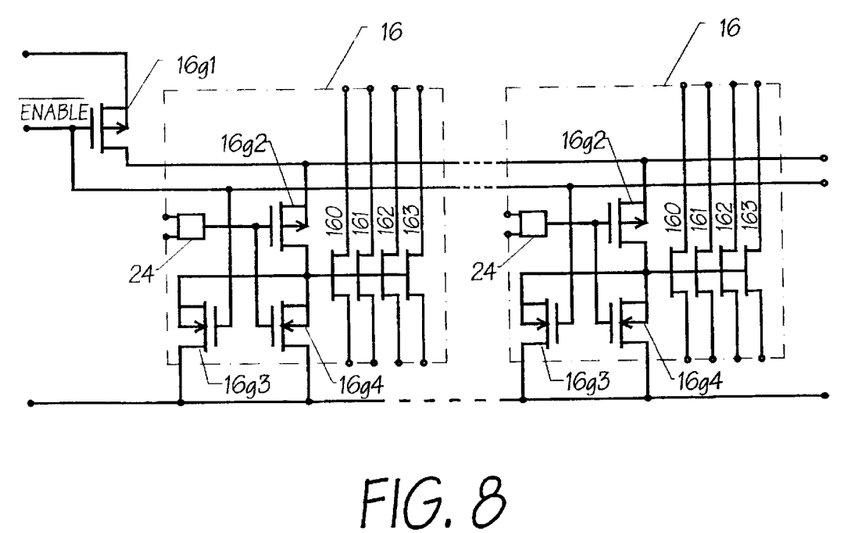
FIG. 8 shows a modification to the circuitry of FIG. 7.

It will be noted that each of the switchable connections 16, 18, 20 described with reference to FIGS. 6A to 6C includes a NOR gate 16g, 18g, 20g. As shown in FIG. 7, a NOR gate 16g is typically formed by four transistors 16g1, 16g2, 16g3, 16g4, two 16g1, 16g3 of which are responsive to the inverted ENABLE signal, and two 16g2, 16g4 of which are responsive to the inverted content of the memory cell 24. In the embodiment of the invention, it is desirable that a group of the switchable collections 16, 18, 20 may be disabled in common, without any need for only part of such a group to be disabled. Such a group might consist of all of the switchable connections in one switching section 14, all of the switchable connections in the two switching sections 14 in a particular tile, or all of the switchable connections in a larger area of the array. In this case, the transistor 16g1 may be made common to all of the switchable connections 16, 18, 20 in the group, as shown in FIG. 8. This enables a 25% less one saving in the number of transistors required for the gates, but does require a further conductor linking the gate, as shown in FIG. 8.

The man skilled in the art will appreciate that the structures depicted in FIGS. 7 and 8 can be modified for optimisation. For example, the arrangement of FIGS. 7 and 8 would not fully exploit memory cells 24 designed to return both a stored value and a complement of that stored value. Use of the complement obtained from such cells 24 could be used to obviate any need for both the ENABLE and inverted ENABLE signals to be carried to all of the switchable connections in a group, as is the case in FIG. 8. As mentioned above with reference to FIGS. 1 and 2, at each switching section 14, the busses hregn, hregs, vregw, vrege are connected by respective 4-bit connections 22 to a register or buffer circuit, and this circuit will now be described in more detail with reference to FIG. 9. The four connections 22 are each connected to respective inputs of a multiplexer 26. The multiplexer 26th selects one of the inputs as an output, which is supplied to a register or buffer 28. The output of the register or buffer 28 is supplied to four tri-state buffers 30s, 30w, 30n, 30e, which are connected back to the connections 22 to the busses hregs, vregw, hregn, vrege, respectively. In the case where a buffer 28 is used, the 4-bit signal on a selected one of the busses hregs, vregw, hregn, vrege is amplified and supplied to another selected one of the busses hregs, vregw, hregn, vrege. In the case where a register 28 is used, the 4-bit signal on a selected one of the busses hregs, vregw, hregn, vrege is amplified and supplied to any selected one of the busses hregs, vregw, hregn, vrege after the next active clock edge.

It will be appreciated that the arrangement described above provides great flexibility in the routing of signals around and across the array. With appropriate setting of the switches 16, 18, 20 using the memory cells 24 and with appropriate setting of the multiplexers 26 and registers or buffers 28, signals can been sent over large distances, primarily using the busses v16, h16, v8, h8, v4e, v4w, h4n, h4s from the edge of the array to a particular ALU, between ALUs, and from a particular ALU to the edge of the array. These busses can be joined together in line, or at right angles, by the switching sections 14, with amplification by the registers or buffers 28 in order to reduce propagation delays, and with pipeline stages introduced by the registers 28. Also, these busses can be tapped part way along their lengths, so that the siting of the ALUs to perform a particular processing operation is not completely dictated by the lengths of the busses, and so that signals can be distributed to more than one ALU. Furthermore, the shorter length busses described with reference to FIGS. 1 and 2 can be used to route signals between the switching sections 14 and the ALUs, and to send signals primarily over shorter distances, for example from one ALU to an adjacent ALU in the same row or column, or diagonally adjacent, even though the busses extend horizontally or vertically. Again, the registers or buffers 28 can be used to amplify the signals or introduce programmable delays into them.

In the arrangement described above, the memory cells 24 are distributed across the array to the same extent as the switching sections 14 and the ALU locations 12. Each memory cell 24 is disposed adjacent the switch or switches, multiplexer, register or buffer which it controls. This enables a high circuit density be achieved.

Figure 10:
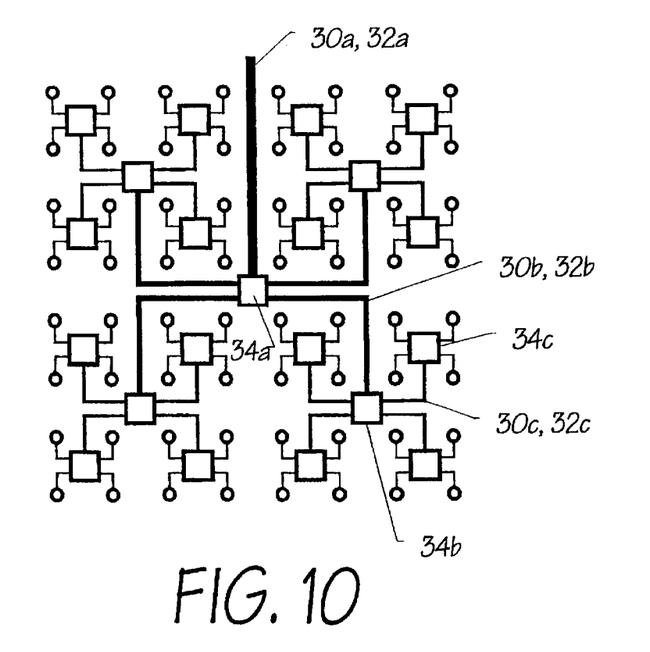
FIG. 10 is a schematic drawing illustrating how enable signals may be distributed to the programmable switches in the switching sections.
Figure 11:
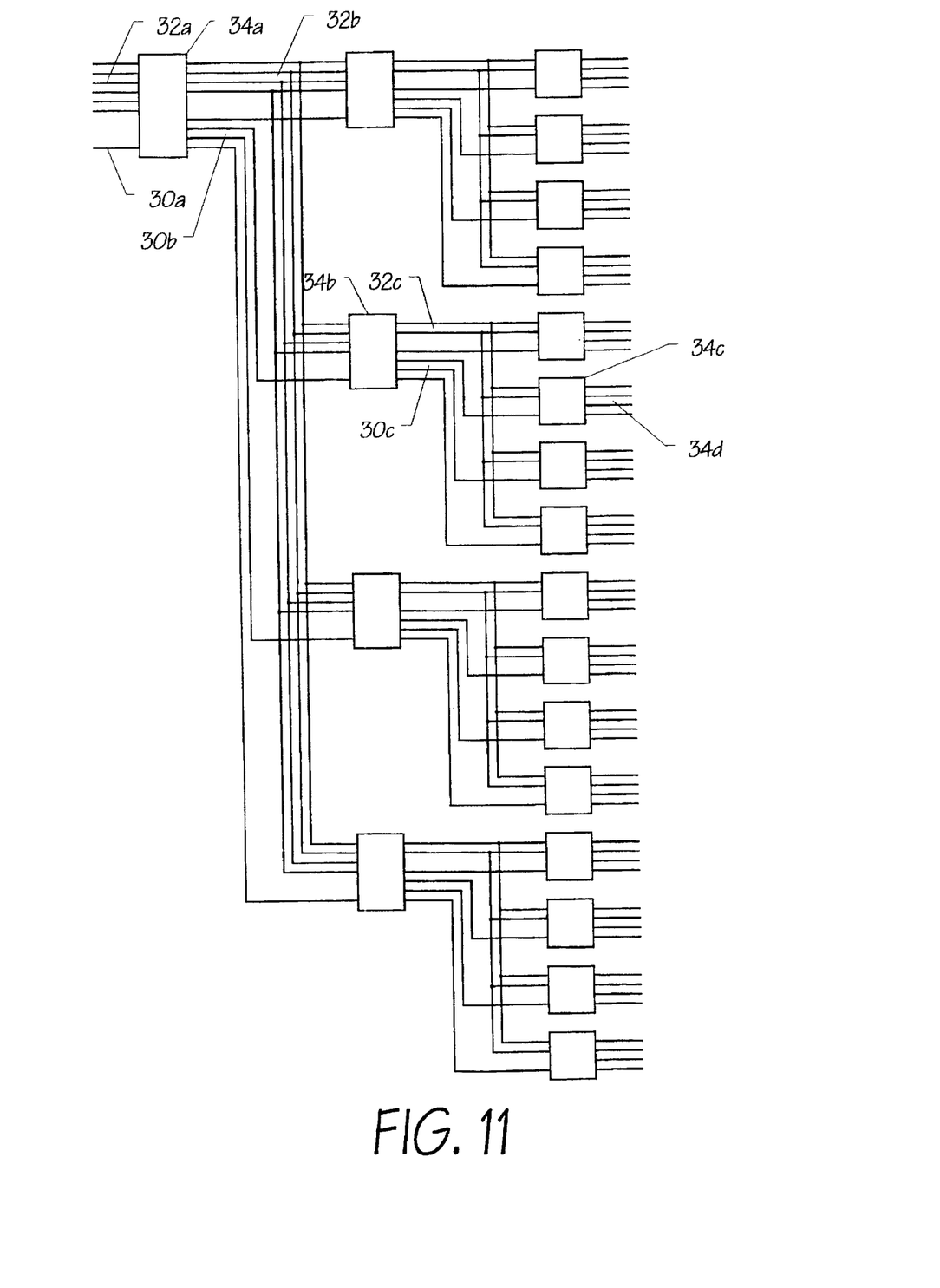
FIG. 11 shows in more detail the circuitry of the arrangement shown in FIG. 10.

A description will now be made of the manner in which data is written to or read from the memory cells 24, the way in which the ENABLE signals for the programmable switches 16, 18, 20 are written to their memory cells, the way in which instructions, and possibly constants, are distributed to the ALUs, and the way in which other control signals, such as a clock signal, are transmitted across the array. For all of these functions, an "H-tree" structure (which is known per se) may be employed as shown in FIG. 10. Referring to FIGS. 10 and 11, in order to distribute an ENABLE signal to any of 64 locations in the example shown, the ENABLE signal 30a and a 6-bit address 32a for it are supplied to a decoder 34a. The decoder 34a determines which of the four branches from it leads to the address and supplies an ENABLE signal 30b to a further decoder 34b in that branch, together with a 4-bit address 32b to the decoders 34b in all four branches. The decoder 34b receiving the ENABLE signal 30b determines which of the four branches from it leads to the required address and supplies an ENABLE signal 30c to a further decoder 34c in that branch, together with a 4-bit address 32c to the decoders 34c in all four branches. The decoder 34c receiving the ENABLE signal 30c then supplies the ENABLE signal 34d to the required address where it can be stored in a single bit memory cell. An advantage of the H-tree structure is that the lengths of the signal paths to all of the destinations are approximately equal, which is particularly advantageous in the case of the clock signal.

A great advantage of the arrangement described above is that groups of the memory cells 24 in for example one switching section 14, or in the two switching sections in one tile, or in the switching sections in a sub-array of the tiles may be disabled en bloc by the inverted ENABLE signals so that the contents of those memory cells do not affect the associated switches. It is then possible for those memory cells 24 to be used as "user" memory by an application, rather than being used for configuring the wiring of the array.

The embodiment of the invention has been described merely by way of example, and many modifications and developments may be made in keeping with the present invention. For example, the embodiment employs ALUs as the processing units, but other processing units may additionally or alternatively be used, for example look-up tables, programmable logic arrays and/or self-contained CPUs which are able to fetch their own instructions.

Furthermore, the embodiment has been described as if the whole array is covered by ALUs and switching sections. However, other types of section may be included in the array. For example, a sub-array might be composed of a 4×4 arrangement of tiles of ALUs and switching sections as described above, and the array might be composed of such sub-arrays and memory in a 4×4 array, or such sub-arrays and RISC CPUs in a 4×4 array.

In the embodiment described above, each ALU location is square, and each switching section is square and of the same size as the ALU locations, but it should be noted that the controllable switches 18 in the register busses vregw, vrege, hregn, hregs encroach into the square outline of the ALU locations. The ALU locations need not be of the same size as the switching sections, and in particular may be smaller, thus permitting one or more busses to pass horizontally or vertically directly from one switching section 14 to a diagonally adjacent switching section 14, for example running between the busses h2s, h2n or between the busses v2e, v2w.

In the embodiment described above, each ALU has two independent carry inputs vci, hci and a connected pair of carry outputs co. If required, the ALUs may be arranged to deal with two types of carry: a fast carry between adjacent ALUs which may be of particular use for multi-bit adding operations; and a slow carry which can be routed more flexibly and may be of particular use for digital serial arithmetic. The fast carry might be arranged in a similar manner to that described above with reference to the drawings, whereas the slow carry might employ programmable switches in the switching sections 14 between the carry conductor and particular bits of the 4-bit busses.

In the embodiment described above, particular bit widths, sizes of switching section and sizes of array have been mentioned, but it should be noted that all of these values may be changed as appropriate. Also, the programmable switches 16, 18, 20 have been described as being disposed at particular locations in each switching section 14, but other locations may be used as required and desired.

In the embodiment described above, the array is two-dimensional, but the principles of the invention are also applicable to three-dimensional arrays, for example by providing a stack of the arrays described above, with the switching sections in adjacent layers staggered with respect to each other. The stack might include just two layers, but preferably at least three layers, and the number of layers is preferably a power of two.

In the embodiment described above, the memory cells 24 can be isolated by the gates 16g, 18g, 20g from the switches which they control so that the memory cells can be use d for other purposes, that is put in the "user plane". The ENABLE signal memory cells, however, cannot be transferred to the user plane. In an alternative embodiment, the switches in a particular switching section 14 may be disconnectable from the remainder of the array by further switches in the busses at the boundary of that switching section 14, with the further switches being controlled by a further memory cell which cannot be transferred to the user plane.

Many other modifications and developments may also be made.

What is claimed is:

1. An integrated circuit comprising a field programmable circuit region arranged as a generally rectangular array of rows and columns of circuit areas and wherein:

some of the circuit areas each provide a respective processing unit for performing operations on data on at least one respective input signal path to provide data on at least one respective output signal path;

others of the circuit areas each provide a respective switching section;

the processing units and the switching sections are arranged alternately in each row and in each column and at least one of the processing units and a processing unit adjacent thereto each have a first input, a second input and an output; and each of a substantial proportion of the switching sections provides a programmable connection between at least some of the signal paths of those of the processing units adjacent that switching section in the same column and in the same row, wherein a first type of the connections provided by the switching sections are between such signal paths which are generally collinear or parallel to each other, and wherein the output of one said processing unit is connectable by such a first type of connection to the first or second input of the next processing unit in one direction in the same row, to the first or second input of the next processing unit in the one direction in the same column, to the first or second input of the next processing unit in the opposite direction in the same row, or to the first or second input of the next processing unit in the opposite direction in the same column; and wherein the integrated circuit further comprises a plurality of inter switching section signal paths, each of which extends from a respective first one of the switching sections to a respective second one of the switching sections in the same row in a direction primarily generally parallel to that row, or in the same column in a direction primarily generally parallel to that column, each of the inter switching section signal paths being programmably connectable by the respective first switching section to others of the signal paths at that first switching section, and being programmably connectable by the respective second switching section to others of the signal paths at that second switching section.

2. An integrated circuit as claimed in claim 1, wherein the output of said one processing unit is connectable:

by such a first type of connection to the first input of the next processing unit in one direction in the same row;

by such a first type of connection to the first input of the next processing unit in the one direction in the same column;

by such a first type of connection to the second input of the next processing unit in the opposite direction in the same row; and by such a first type of connection to the second input of the next processing unit in the opposite direction in the same column.

3. An integrated circuit comprising a field programmable circuit region arranged as a generally rectangular array of rows and columns of circuit areas and wherein:

some of the circuit areas each provide a respective processing unit for performing operations on data on at least one respective input signal path to provide data on at least one respective output signal path;

others of the circuit areas each provide a respective switching section;

the processing units and the switching sections are arranged alternately in each row and in each column, and at least one of the processing units and a processing unit adjacent thereto each have a first input, a second input and an output; and each of a substantial proportion of the switching sections provides a programmable connection between at least some of the signal paths of those of the processing units adjacent that switching section in the same column and in the same row, wherein a second type of the connections provided by the switching sections are between such signal paths which are generally orthogonal to each other, wherein the output of one said processing unit is connectable by such a second type of connection in the same column to the first or second input of the diagonally adjacent processing unit in said one row direction and said one column direction, in the same row to the first or second input of the diagonally adjacent processing unit in said opposite row direction and said one column direction, in the same column to the first or second input of the diagonally adjacent processing unit in said opposite row direction and said opposite column direction, and in the same row to the first or second input of the diagonally adjacent processing unit in said one row direction and said opposite column direction, and wherein the integrated circuit further comprises a plurality of inter switching section signal paths, each of which extends from a respective first one of the switching sections to a respective second one of the switching sections in the same row in a direction primarily generally parallel to that row, or in the same column in a direction primarily generally parallel to that column, each of the inter switching section signal paths being programmably connectable by the respective first switching section to others of the signal paths at that first switching section, and being programmably connectable by the respective second switching section to others of the signal paths at that second switching section.

4. An integrated circuit as claimed in claim 3, wherein the output of said one processing unit is connectable:

by such a second type of connection in the same column to the first input of the diagonally adjacent processing unit in said one row direction and said one column direction;

by such a second type of connection in the same row to the first input of the diagonally adjacent processing unit in said opposite row direction and said one column direction;

by such a second type of connection in the same column to the second input of the diagonally adjacent processing unit in said opposite row direction and said opposite column direction; and by such a second type of connection in the same row to the second input of the diagonally adjacent processing unit in said one row direction and said opposite column direction.

5. An integrated circuit comprising a field programmable circuit region arranged as a generally rectangular array of rows and columns of circuit areas and wherein:

some of the circuit areas each provide a respective processing unit for performing operations on data on at least one respective input signal path to provide data on at least one respective output signal path;

others of the circuit areas each provide a respective switching section;

the processing units and the switching sections are arranged alternatively in each row and in each column; and each of a substantial proportion of the switching sections provides a programmable connection between at least some of the signal paths of those of the processing units adjacent that switching section in the same column and in the same row; and wherein the integrated circuit further comprises a plurality of inter switching section signal paths, each of which extends from a respective first one of the switching sections to a respective second one of the switching sections in the same row in a direction primarily generally parallel to that row, or in the same column in a direction primarily generally parallel to that column, each of the inter switching section signal paths being programmably connectable by the respective first switching section to others of the signal paths at that first switching section, and being programmably connectable by the respective second switching section to others of the signal paths at that second switching section, wherein for one type of the inter switching section signal paths, there are no such switching sections in the respective row or column between the respective first and second switching sections.

6. An integrated circuit as claimed in claim 5, wherein for another type of the inter switching section signal paths, the respective first and second switching sections have a number of other such switching sections therebetween in the respective row or column.

7. An integrated circuit as claimed in claim 6, wherein for a further type of the inter switching section signal paths, each signal path has a spine extending in a direction generally parallel to the respective row or column and first and second end portions each extending in a direction generally orthogonal to the respective row or column and interconnecting the spine portion and the respective first and second switching sections, respectively.

8. An integrated circuit as claimed in claim 5, wherein for a further type of the inter switching section signal paths, each signal path has a spine extending in a direction generally parallel to the respective row or column and first and second end portions each extending in a direction generally orthogonal to the respective row or column and interconnecting the spine portion and the respective first and second switching sections, respectively.

9. An integrated circuit as claimed in claim 5, wherein for a further type of the inter switching section signal paths, each signal path has a spine extending in a direction generally parallel to the respective row or column and first and second end portions each extending in a direction generally orthogonal to the respective row or column and interconnecting the spine portion and the respective first and second switching sections, respectively.

10. An integrated circuit comprising a field programmable circuit region arranged as a generally rectangular array of rows and columns of circuit areas and wherein:
  some of the circuit areas each provide a respective processing unit for performing operations on data on at least one respective input signal path to provide data on at least one respective output signal path;
  others of the circuit areas each provide a respective switching section;
  the processing units and the switching sections are arranged alternatively in each row and in each column; and
  each of a substantial proportion of the switching sections provides a programmable connection between at least some of the signal paths of those of the processing units adjacent that switching section in the same column and in the same row; and wherein the integrated circuit further comprises a plurality of inter switching section signal paths, each of which extends from a respective first one of the switching sections to a respective second one of the switching sections in the same row in a direction primarily generally parallel to that row, or in the same column in a direction primarily generally parallel to that column, each of the inter switching section signal paths being programmably connectable by the respective first switching section to others of the signal paths at that first switching section, and being programmably connectable by the respective second switching section to others of the signal paths at that second switching section, wherein for a further type of the inter switching section signal paths, each signal path has a spine extending in a direction generally parallel to the respective row or column and first and second end portions each extending in a direction generally orthogonal to the respective row or column and interconnecting the spine portion and the respective first and second switching sections, respectively.

11. An integrated circuit as claimed in claim 10, wherein for at least some of the inter switching section signal paths of said further type, the respective first and second switching sections have a number of other such switching sections therebetween in the respective row or column.

12. An integrated circuit as claimed in claim 11, wherein at least some of said numbers are each one less than a power of two.

13. An integrated circuit as claimed in claim 11, wherein at least some of the inter switching section signal paths of said further type each have at least one tap portion extending in a direction generally orthogonal to the respective row or column and interconnecting the spine portion and a respective such other switching section.

14. An integrated circuit comprising a field programmable circuit region arranged as a generally rectangular array of rows and columns of circuit areas and wherein:
  some of the circuit areas each provide a respective processing unit for performing operations on data on at least one respective input signal path to provide data on at least one respective output signal path;
  others of the circuit areas each provide a respective switching section;
  the processing units and the switching sections are arranged alternatively in each row and in each column; and
  each of a substantial proportion of the switching sections provides a programmable connection between at least some of the signal paths of those of the processing units adjacent that switching section in the same column and in the same row: and wherein the integrated circuit further comprises a plurality of inter switching section signal paths, each of which extends from a respective first one of the switching sections to a respective second one of the switching sections in the same row in a direction primarily generally parallel to that row, or in the same column in a direction primarily generally parallel to that column, each of the inter switching section signal paths being programmably connectable by the respective first switching section to others of the signal paths at that first switching section, and being programmably connectable by the respective second switching section to others of the signal paths at that second switching section, wherein for another type of the inter switching section signal paths, the respective first and second switching sections have a number of other such switching sections therebetween in the respective row or column, wherein at least some of said numbers are each one less than a power of two.

15. An integrated circuit comprising a field programmable circuit region arranged as a generally rectangular array of rows and columns of circuit areas and wherein:
  some of the circuit areas each provide a respective processing unit for performing operations on data on at least one respective input signal path to provide data on at least one respective output signal path;

others of the circuit areas each provide a respective switching section;

the processing units and the switching sections are arranged alternatively in each row and in each column; and each of a substantial proportion of the switching sections provides a programmable connection between at least some of the signal paths of those of the processing units adjacent that switching section in the same column and in the same row; and wherein the integrated circuit further comprises a plurality of inter switching section signal paths, each of which extends from a respective first one of the switching sections to a respective second one of the switching sections in the same row in a direction primarily generally parallel to that row, or in the same column in a direction primarily generally parallel to that column, each of the inter switching section signal paths being programmably connectable by the respective first switching section to others of the signal paths at that first switching section, and being programmably connectable by the respective second switching section to others of the signal paths at that second switching section, wherein at least one of the processing units is an arithmetic logic unit.

16. An integrated circuit as claimed in claim 15, wherein at least one of the processing units has a plural-bit input and/or a plural-bit output, and wherein at least some of the signal paths are provided by respective plural-bit busses.

17. An integrated circuit as claimed in claim 15, wherein all of the switching sections are so arranged to provide such programmable connections.

18. An integrated circuit as claimed in claim 15, wherein at least one of the processing units and the processing units adjacent thereto each have a first input, a second input and an output.

19. An integrated circuit as claimed in claim 15, wherein a first type of the connections provided by the switching sections are between such signal paths which are generally collinear with or parallel to each other.

20. An integrated circuit as claimed in claim 19, wherein the output of said one processing unit is connectable:

by such a first type of connection to the first input of the next processing unit in one direction in the same row;

by such a first type of connection to the first input of the next processing unit in the one direction in the same column;

by such a first type of connection to the second input of the next processing unit in the opposite direction in the same row; and by such a first type of connection to the second input of the next processing unit in the opposite direction in the same column.

21. An integrated circuit as claimed in claim 19, wherein a second type of the connections provided by the switching sections are between such signal paths which are generally orthogonal to each other.

22. An integrated circuit as claimed in claim 15, wherein a second type of the connections provided by the switching sections are between such signal paths which are generally orthogonal to each other.

23. An integrated circuit as claimed in claim 22, wherein at least one of the processing units and the processing units adjacent thereto each have a first input, a second input and an output.

24. An integrated circuit as claimed in claim 23, wherein the output of said one processing unit is connectable:

by such a second type of connection in the same column to the first input of the diagonally adjacent processing unit in said one row direction and said one column direction;

by such a second type of connection in the same row to the first input of the diagonally adjacent processing unit in said opposite row direction and said one column direction;

by such a second type of connection in the same column to the second input of the diagonally adjacent processing unit in said opposite row direction and said opposite column direction; and by such a second type of connection in the same row to the second input of the diagonally adjacent processing unit in said one row direction and said opposite column direction.

25. An integrated circuit as claimed in claim 15, wherein substantially all of the input and output signal paths are oriented in directions substantially parallel to the rows or columns.

26. An integrated circuit as claimed in claim 15, wherein for one type of the inter switching signal paths, there are no such switching sections in the respective row or column between the respective first and second switching sections.

27. An integrated circuit as claimed in claim 15, wherein for another type of the inter switching section signal paths, the respective first and second switching sections have a number of other such switching sections therebetween in the respective row or column.

28. An integrated circuit as claimed in claim 15, wherein for one type of the inter switching section signal paths, there are no such switching sections in the respective row or column between the respective first and second switching sections, and for another type of the inter switching section signal paths, the respective first and second switching sections have a number of other such switching sections therebetween in the respective row or column.

29. An integrated circuit as claimed in claim 15, wherein for a further type of the inter switching section signal paths, each signal path has a spine extending in a direction generally parallel to the respective row or column and first and second end portions each extending in a direction generally orthogonal to the respective row or column and interconnecting the spine portion and the respective first and second switching sections, respectively.

30. An integrated circuit as claimed in claim 26, wherein for a further type of the inter switching section signal paths, each signal path has a spine extending in a direction generally parallel to the respective row or column and first and second end portions each extending in a direction generally orthogonal to the respective row or column and interconnecting the spine portion and the respective first and second switching sections, respectively.

31. An integrated circuit as claimed in claim 27, wherein for a further type of the inter switching section signal paths, each signal path has a spine extending in a direction generally parallel to the respective row or column and first and second end portions each extending in a direction generally orthogonal to the respective row or column and interconnecting the spine portion and the respective first and second switching sections, respectively.

32. An integrated circuit as claimed in claim 28, wherein for a further type of the inter switching section signal paths, each signal path has a spine extending in a direction generally parallel to the respective row or column and first and second end portions each extending in a direction generally orthogonal to the respective row or column and interconnecting the spine portion and the respective first and second switching sections, respectively.

33. An integrated circuit as claimed in claim 29, wherein for at least some of the inter switching section signal paths of said further type, the respective first and second switching sections have a number of other such switching sections therebetween in the respective row or column.

34. An integrated circuit as claimed in claim 27, wherein at least some of said numbers are each one less than a power of two.

35. An integrated circuit as claimed in claim 33, wherein at least some of said numbers are each one less than a power of two.

36. An integrated circuit as claimed in claim 33, wherein at least some of the inter switching section signal paths of said further type each have at least one tap portion extending in a direction generally orthogonal to the respective row or column and interconnecting the spine portion and a respective such other switching section.

37. An integrated circuit as claimed in claim 15, wherein at least some of the switching sections each include a respective register and/or buffer having an input and an output each switchably connectable to at least some of the signal paths at that switching section.

* * * * *

UNITED STATES PATENT AND TRADEMARK OFFICE
CERTIFICATE OF CORRECTION

PATENT NO. : 6,252,792 B1
DATED : June 26, 2001
INVENTOR(S) : Marshall et al.

It is certified that error appears in the above-identified patent and that said Letters Patent is hereby corrected as shown below:

Title page,
Item [56], References Cited, OTHER PUBLICATIONS, reference beginning "Patterson, D.A., et al." please change "PP." to -- pp. --.

Column 6,
Line 31, change "vre gw" to -- vregw --.

Column 8,
Line 31, change "FIG. 8. As" to -- FIG. 8 As --. (new paragraph)

Column 10,
Line 44, change "use d" to -- used --.

Signed and Sealed this

Twenty-first Day of May, 2002

Attest:

Attesting Officer

JAMES E. ROGAN
*Director of the United States Patent and Trademark Office*